(12) United States Patent
Carlton et al.

(10) Patent No.: US 6,719,936 B2
(45) Date of Patent: Apr. 13, 2004

(54) METHOD OF MAKING A SOLID COMPACTED PELLET OF ORGANIC MATERIAL FOR VACUUM DEPOSITION OF OLED DISPLAYS

(75) Inventors: Donn B. Carlton, Hamlin, NY (US); Syamal K. Ghosh, Rochester, NY (US); Tukaram K. Hatwar, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/226,600

(22) Filed: Aug. 23, 2002

(65) Prior Publication Data

US 2004/0037987 A1 Feb. 26, 2004

(51) Int. Cl.$^7$ .................. B29B 11/06; B29B 11/12; B29C 43/18
(52) U.S. Cl. .................. 264/112; 264/123; 264/125; 264/259; 264/279.1; 264/319; 264/330; 156/245
(58) Field of Search .................. 264/109–128, 264/259, 279.1, 319, 330; 156/245

(56) References Cited

U.S. PATENT DOCUMENTS

| | | | |
|---|---|---|---|
| 3,060,506 A | 10/1962 | Uschmann | 425/344 |
| 4,039,703 A * | 8/1977 | Kamijo et al. | 427/183 |
| 4,356,429 A | 10/1982 | Tang | |
| 4,539,507 A | 9/1985 | VanSlyke et al. | |
| 4,720,432 A | 1/1988 | VanSlyke et al. | |
| 4,769,292 A | 9/1988 | Tang et al. | |
| 5,180,531 A | 1/1993 | Borzakian | 364/45.3 |
| 5,500,174 A * | 3/1996 | Scott | 264/112 |
| 5,550,066 A | 8/1996 | Tang et al. | |
| 6,237,529 B1 | 5/2001 | Spahn | |

FOREIGN PATENT DOCUMENTS

| | | |
|---|---|---|
| JP | 02-042421 | 2/1990 |
| JP | 2000-252061 | 9/2000 |

OTHER PUBLICATIONS

VanSlyke et al, 27:2: Linear Source Deposition of Organic Layers for Full–Color OLED, SID 02 Digest, 2002, pp. 886–897.

* cited by examiner

Primary Examiner—Stephen J. Lechert, Jr.
(74) Attorney, Agent, or Firm—Raymond L. Owens

(57) ABSTRACT

A solid compacted pellet of organic material for use in a vapor deposition source, and a method of making same is disclosed. The solid compacted pellet includes: a support member for permitting rotation of the pellet, or transmitting cooling fluid, or both; and a compacted solid core of organic material molded onto and about the support member.

6 Claims, 4 Drawing Sheets

METHOD OF MAKING A SOLID COMPACTED PELLET OF ORGANIC MATERIAL FOR VACUUM DEPOSITION OF OLED DISPLAYS

CROSS REFERENCE TO RELATED APPLICATIONS

Reference is made to commonly assigned U.S. patent application Ser. No. 09/898,369 filed Jul. 3, 2001 entitled "Method of Compacting Organic Material in Making An Organic Light-Emitting Device" by Van Slyke et al; U.S. patent application Ser. No. 10/073,690 filed Feb. 11, 2002, entitled "Using Organic Materials in Making An Organic Light-Emitting Device" by Ghosh et al, and U.S. patent application Ser. No. 10/195,947 filed Jul. 16, 2002, entitled "Compacting Moisture-Sensitive Organic Material in Making An Organic Light-Emitting Device" by Ghosh et al, the teachings of which are incorporated herein.

FIELD OF THE INVENTION

The present invention relates generally to an improved method of forming a solid compacted pellet from powders including organic materials wherein such solid compacted pellet is used in physical vapor deposition to make an organic layer on a structure which will form part of an organic light emitting diode (OLED) display. More particularly, this invention relates to a solid compacted pellet of organic materials comprising a support member for permitting rotation of the pellet or transmitting cooling fluid during the vapor deposition process.

BACKGROUND OF THE INVENTION

An organic light-emitting diode (OLED), also referred to as an organic electroluminescent device, can be constructed by sandwiching two or more organic layers between first and second electrodes.

In a passive-matrix OLED of conventional construction, a plurality of laterally spaced light-transmissive anodes, for example indium-tin-oxide (ITO) anodes, are formed as first electrodes on a light-transmissive substrate such as, for example, a glass substrate. Two or more organic layers are then formed successively by physical vapor deposition of respective organic materials from respective sources, within a chamber held at reduced pressure, typically less than $10^{-3}$ Torr. A plurality of laterally spaced cathodes is deposited as second electrodes over an uppermost one of the organic layers. The cathodes are oriented at an angle, typically at a right angle, with respect to the anodes.

Such conventional passive-matrix OLED displays are operated by applying an electrical potential (also referred to as a drive voltage) between appropriate columns (anodes) and, sequentially, each row (cathode). When a cathode is biased negatively with respect to an anode, light is emitted from a pixel defined by an overlap area of the cathode and the anode, and emitted light reaches an observer through the anode and the substrate.

In an active-matrix OLED, an array of anodes are provided as first electrodes by thin-film transistors (TFTs) which are connected to a respective light-transmissive portion. Two or more organic layers are formed successively by vapor deposition in a manner substantially equivalent to the construction of the aforementioned passive matrix device. A common cathode is deposited as a second electrode over an uppermost one of the organic layers. The construction and function of an active matrix organic light-emitting device is described in commonly-assigned U.S. Pat. No. 5,550,066, the disclosure of which is herein incorporated by reference.

Organic materials, thicknesses of vapor-deposited organic layers, and layer configurations, useful in constructing an organic light-emitting device, are described, for example, in commonly-assigned U.S. Pat. Nos. 4,356,429; 4,539,507; 4,720,432; and 4,769,292, the disclosures of which are herein incorporated by reference.

Organic materials useful in making OLED displays, for example organic hole-transporting materials, organic light-emitting materials predoped with an organic dopant, and organic electron-transporting materials can have relatively complex molecular structures with relatively weak molecular bonding forces, so that care must be taken to avoid decomposition of the organic material(s) during physical vapor deposition.

The aforementioned organic materials are synthesized to a relatively high degree of purity, and are provided in the form of powders, flakes, or granules. Such powders, flakes or granules have been used heretofore for placement into a physical vapor deposition source wherein heat is applied for forming a vapor by sublimation or vaporization of the organic material, the vapor condensing on a substrate to provide an organic layer thereon.

Several problems have been observed in using organic powders, flakes, or granules in physical vapor deposition:

(i) powders, flakes, or granules are difficult to handle because they can acquire electrostatic charges via a process referred to as triboelectric charging;

(ii) powders, flakes, or granules of organic materials generally have a relatively low physical density (expressed in terms of weight per unit volume) in a range from about 0.05 to about 0.2 g/cm$^3$, compared to a physical density of an idealized solid organic material of about 1 g/cm$^3$;

(iii) powders, flakes, or granules of organic materials have an undesirably low thermal conductivity, particularly when placed in a physical vapor deposition source which is disposed in a chamber evacuated to a reduced pressure as low as $10^{-6}$ Torr. Consequently, powder particles, flakes, or granules are heated only by radiative heating from a heated source, and by conductive heating of particles or flakes directly in contact with heated surfaces of the source. Powder particles, flakes, or granules which are not in contact with heated surfaces of the source are not effectively heated by conductive heating due to a relatively low particle-to-particle contact area; and (iv) powders, flakes, or granules can have a relatively high ratio of surface area/volume of such particles and a correspondingly high propensity to entrap air and/or moisture between particles under ambient conditions. Consequently, a charge of organic powders, flakes, or granules loaded into a physical vapor deposition source which is disposed in a chamber must be thoroughly outgased by preheating the source once the chamber has been evacuated to a reduced pressure. If outgasing is omitted or is incomplete, particles can be ejected from the source together with a vapor stream during physical vapor-depositing an organic layer on a structure. An OLED, having multiple organic layers, can be or can become functionally inoperative if such layers include particles or particulates.

Each one, or a combination, of the aforementioned aspects of organic powders, flakes, or granules can lead to nonuniform heating of such organic materials in physical vapor deposition sources with attendant spatially nonuniform sublimation or vaporization of organic material and can, therefore, result in potentially nonuniform vapor-deposited organic layers formed on a structure.

The design and performance of linear evaporation source for organic materials are described by Steven VanSlyke et al, SID 2002 Digest, pp. 886–889, 2002. The organic material in powder form is placed inside a quartz boat and heated simultaneously by bottom and top heaters. The bottom heater is used primarily to degas the powder and the top heater is operated at a temperature sufficient to vaporize the upper surface of the organic powder by radiative heating. The linear source provides a significant advantages over the conventional point source, especially thickness uniformity over a large surface area of deposition.

SUMMARY OF THE INVENTION

It is an object of the present invention to provide a method of compacting organic material adaptable for making an organic layer on a structure which will form part of an OLED display.

It is a further object of the invention to provide a method of making an organic layer from a solid compacted pellet of organic material and on a structure which will form part of an OLED display.

In one aspect, the present invention provides a method of forming a solid compacted pellet of organic materials adaptable for making an organic layer on a structure which will form part of an OLED display, comprising the steps of:

(a) providing a die defining a cavity and a first and second punches in opposite sides of the cavity and movable into such cavity, the first and second punches each having corresponding openings for receiving a cooling tube;

(b) placing organic material in a powder form inside the die cavity over the first punch and around the metal tube; and (c) applying sufficient heat by a heating source and pressure by the punches to the organic material in the die cavity to compact the organic material into a solid compacted pellet molded about the cooling tube. comprising a metal tube at the center extending through the linear source.

In another aspect, the present invention provides a method of making a solid compacted pellet of organic material for use in a vapor deposition source, comprising the steps of:

(a) a support member for permitting rotation of the pellet, or transmitting cooling fluid, or both; and (b) a compacted solid core of organic material molded onto and about the support member.

In another aspect, the present invention provides a method of making an organic layer from a solid compacted pellet of organic material on a structure, which will form part of an OLED display comprising the steps of:

(a) providing a solid compacted pellet of organic material comprising at least one organic host and one organic dopant;

(b) placing such a solid compacted pellet of organic material inside a heating source disposed in a physical vapor deposition chamber, circulating cold water through a cooling tube, and rotating the solid compacted pellet of organic material to exposing an area of the surface to heat for a short duration;

(c) positioning the substrate in the chamber and in a spaced relationship with respect to the heating source;

(d) evacuating the chamber to a reduced pressure; and (e) applying heat to the top surface of the solid compacted pellet of organic material to cause at least a portion to sublime to provide a vapor of the organic materials which form the organic layer on the substrate A feature of the present invention is that a solid compacted pellet of organic material can be compacted by the method of the invention wherein at least one organic host material and at least one organic dopant material are mixed prior to the compaction process.

Another feature of the present invention is that the method of compacting organic powder into a solid compacted pellet can be accomplished with relatively simple tools and at a location remote from a location of use of such linear source in a physical vapor deposition apparatus.

A further feature of the present invention is that the method of compacting organic powder into a solid compacted pellet substantially facilitates transfer or shipping of organic material in and between different locations.

Another feature of the present invention is that a solid compacted pellet of an OLED material can be made by the method of the present invention wherein a powder of at least one OLED host material and a powder of at least one organic dopant material are mixed or blended to provide a mixture prior to compacting the mixture into a solid compacted pellet of organic material.

Another feature of the present invention is that a solid compacted pellet of organic material comprising a host and one or more organic dopants eliminates the need of co-evaporation which require more than one evaporation source disposed inside a vacuum chamber.

Another beneficial feature of the present invention is that the solid compacted pellet of organic material is cooled at the center and a small fraction of the rotating surface is heated at a given time thereby causing uniform deposition and homogeneous composition of the organic layers.

BRIEF DESCRIPTION OF THE DRAWINGS

FIGS. 4A–4E depict cross-sectional views of the process sequence for compacting the solid compacted pellet of organic material, wherein;

FIG. 4A shows the cross-sectional view of a die-punch set for compacting organic materials;

FIG. 4B shows the step of filling the die cavity with organic material;

FIG. 4C shows the final step of compacting to form a solid compacted pellet of organic material;

FIG. 4D shows the step of ejecting the compacted solid compacted pellet of organic material from the die cavity;

FIG. 4E shows the solid compacted pellet of organic material having a cooling tube extending through its center.

The term "powder" is used herein to denote a quantity of individual particles, which can be flakes, granules, or mixtures of varied particles and shapes including single or plurality of molecular species.

DETAILED DESCRIPTION OF THE INVENTION

Figure 1:
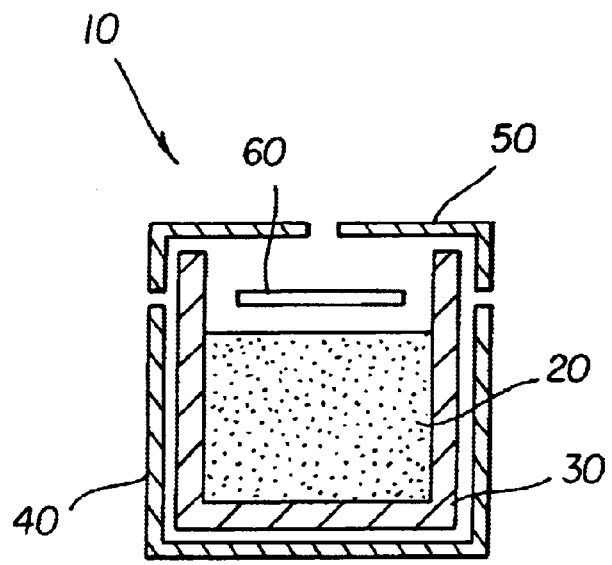
FIG. 1 depicts a cross-sectional view of a linear source for deposition of organic layers for OLED displays of the prior art.

The organic layers of an OLED include an organic or organo-metallic material that produces light, known as electroluminescence (EL), as a result of electron-hole recombination in the layer. Hereinafter, the term "organic" will be taken to include both purely organic as well as organo-metallic materials. Turning to FIG. 1, a cross-sectional view of a linear source 10 of the prior art is shown wherein organic material is heated from the top surface to deposit organic layers for an OLED display. According to the prior art described by S. VanSlyke et al, SID 2002 Digest, pp. 886–889, 2002, which is incorporated herein for reference, organic material 20 in powder form is placed in the quartz boat 30 and heated by a bottom heater 40 and a top heater 50 including tantalum. The top heater 50 is operated at a temperature sufficient to vaporize the upper surface of the organic powder by radiative heating, avoiding the necessity to heat the entire source charge to the vaporization temperature. The purpose of the bottom heater 40 is to degas and heat the organic material 20 to a temperature far below the vaporization temperature. A baffle 60 made also from tantalum is also incorporated in the top heater 50 to prevent spitting of the solid organic particles during the deposition process. Source design for thermal physical vapor-deposition of organic materials useful in constructing OLED displays, is described in commonly-assigned U.S. Pat. No. 6,237,529, the disclosure of which is herein incorporated by reference.

Figure 2:
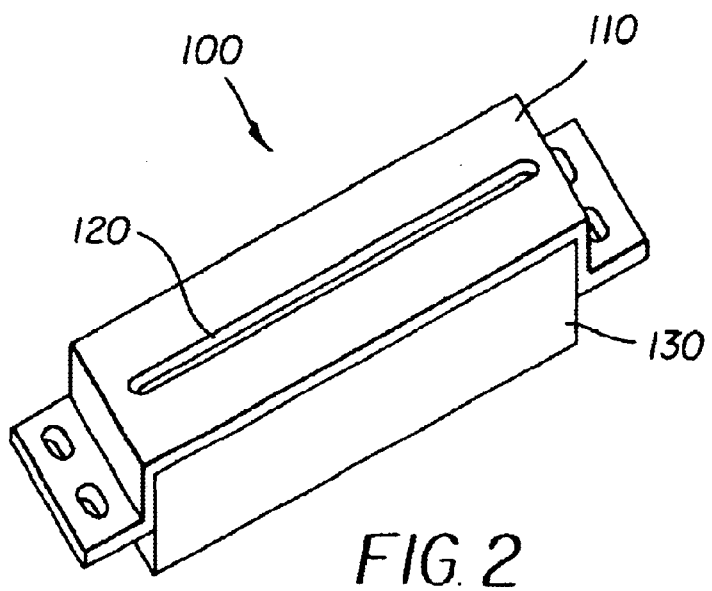
FIG. 2 depicts a perspective of the FIG. 1 of the prior art.

Turning to FIG. 2, there is shown the perspective of the FIG. 1 of the linear source 100, which has been described in detail hereinbefore. For the purpose of clarity, the bottom heater 40 (FIG. 1) is not shown. The top heater 110 has an opening 120 through which the organic vapor escapes and deposits on the substrate. The quartz boat 130 is generally secured to the base plate of the vacuum deposition chamber.

Figure 3:
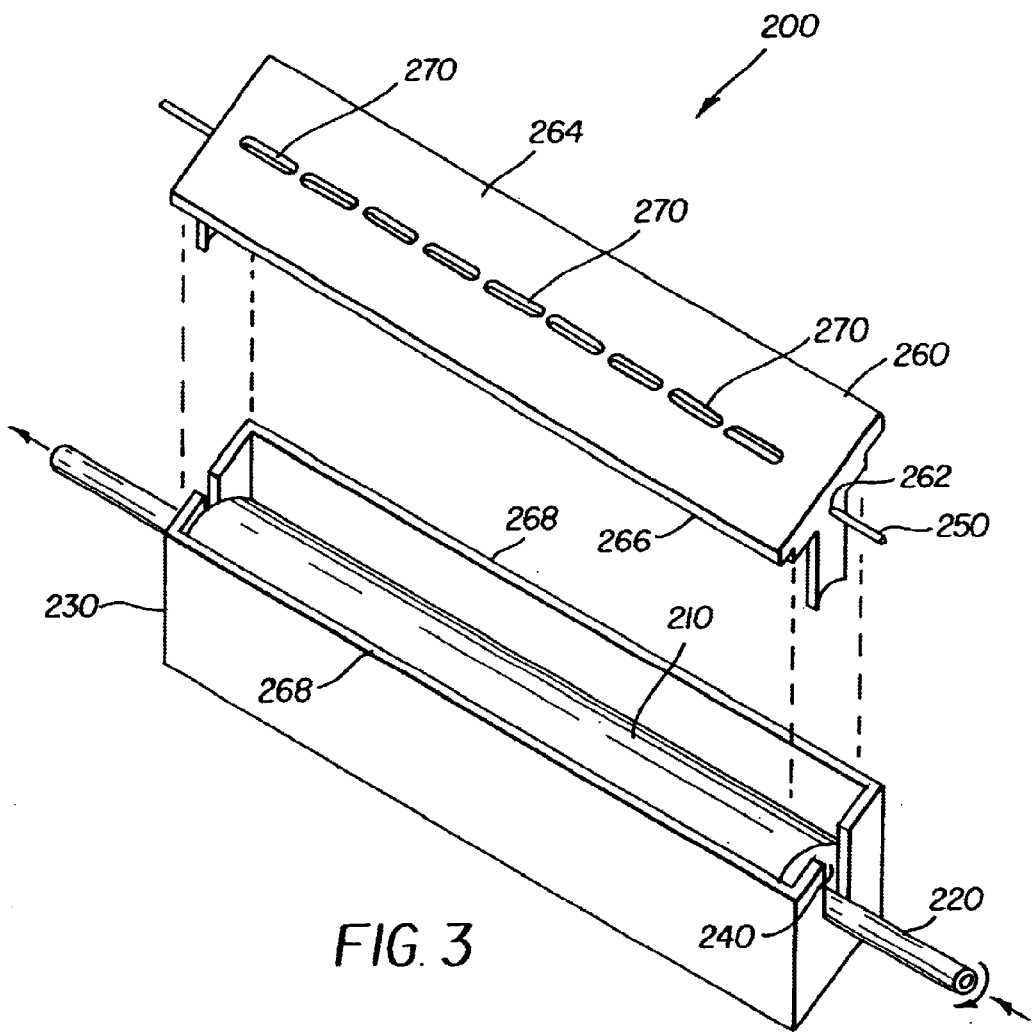
FIG. 3 shows an exploded view of a solid compacted pellet of organic materials according to the invention placed inside a heating source.

Turning to FIG. 3, there is shown an exploded view of the solid compacted pellet assembly 200 according to the present invention. A solid compacted pellet 210 of organic material including a cooling tube 220 located at the center of the solid compacted pellet 210 of organic material which is nested inside a refractory boat 230. A method of making the solid compacted pellet 210 of organic material by the process of compaction will be described later. A rectangular slot 240 is provided at both ends of the refractory boat 230 to accommodate the cooling tube 220 of the solid compacted pellet 210 of organic material. The refractory boat 230 can be made from electrically insulating materials which can withstand high temperature and thermal shock due to rapid heating or rapid cooling. The preferred material for the refractory boat 230 is quartz or fused silica. Other high temperature glasses or ceramics can also be used. Electrically conductive heating element 250 in the form of a rod or wire is attached to a lid 260 through an orifice 262 located on both ends of the lid 260. Preferred material for the heating element 250 is tantalum and a plurality of heating elements 250 can also be used depending on the rate of evaporation and the physical dimension of the solid compacted pellet 210. A plurality of slits 270 are provided around the center of the top surface 264 of the lid 260 so that organic vapor can exit from the solid compacted pellet 210 of organic material during the deposition process. The deposition condition might dictate the slit 270 configuration to be a single linear opening instead of plurality of openings.

Turning to FIGS. 4A–4E, there are shown cross-sectional views of the compaction sequence for compacting organic materials to form a solid compacted pellet of organic material including a support member for permitting rotation of the solid compacted pellet, or transmitting cooling fluid, or both wherein a die-punch assembly 300 is placed in a press (not shown) to complete the compaction process steps.

Figure 4:
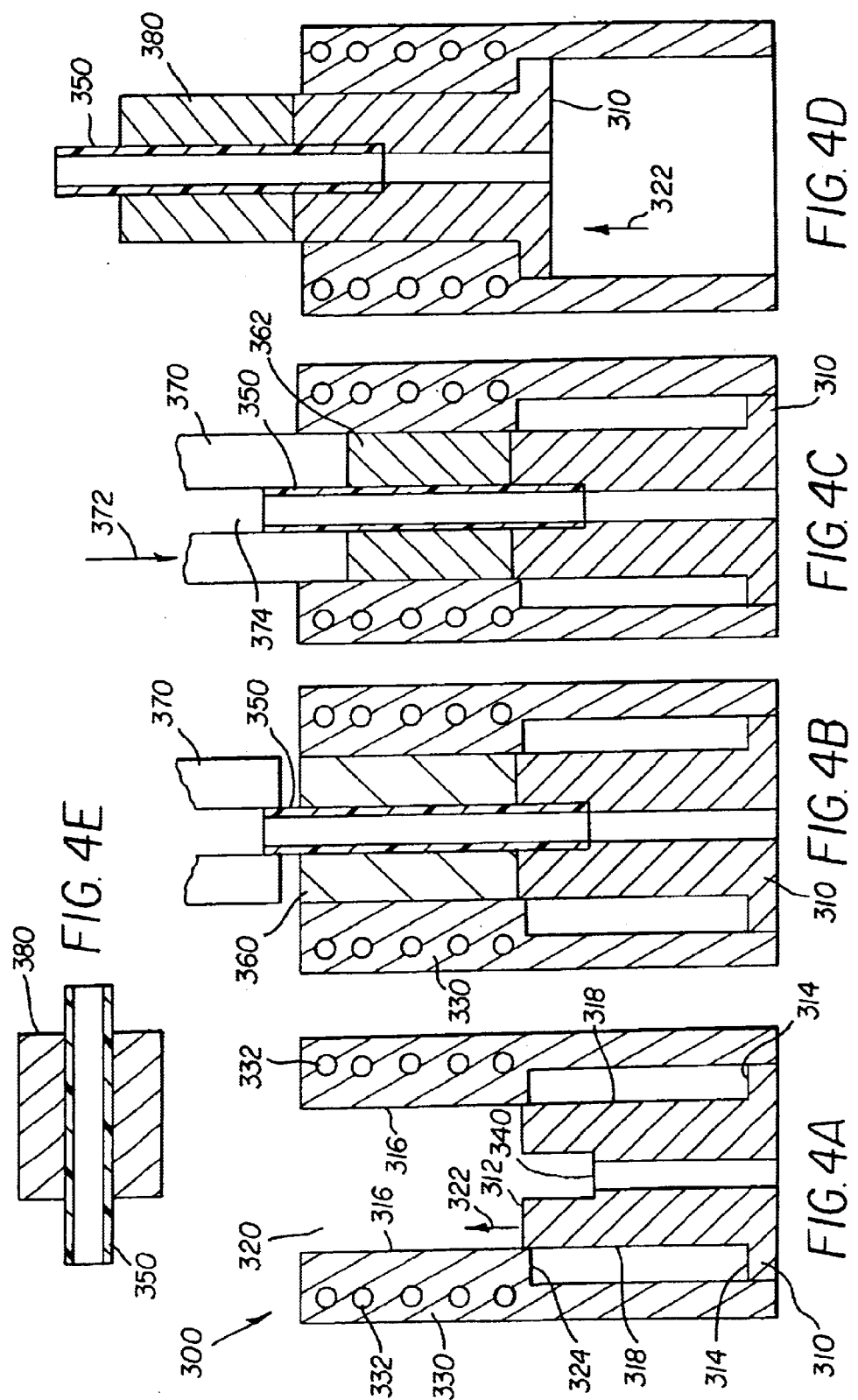

In FIG. 4A, a first punch 310 is placed inside a die cavity 320 of a die 330. One end (upper) of the first punch 310 is provided with a seat 340 for accommodating a cooling tube 350 (FIG. 4B) which will be used as a supporting member to mold a solid compacted solid core of organic material onto and about the cooling tube 350. The other (bottom) end of the first punch 310 is provided with a ledge 314 so that the upward travel of the first punch 310 along a first direction 322 is restricted to a certain distance as the ledge 314 hits the recess 324 of the die 320. The top surface 312 of the first punch 310 is allowed to rest against the vertical die wall 316 of the die 320 so that virtually there is no air gap between the die wall 316 and the outer surface 318 of the first punch 310. A plurality of heating cartridges 332 are embedded inside the die 330 and connected to an electrical power supply (not shown).

Turning to FIG. 4B now, a cooling tube 350 is placed upright on the seat 340 of the first punch 310, and a known amount of organic powder 360 is poured around the cooling tube 350 and filled the die cavity 320 of the die 330. The cooling tube 350 is preferably made from stainless steel for the purpose of strength and vacuum compatibility. The organic powder 360 can be composed of a single organic molecule or can be a mixture of plurality of organic molecules. The die 330 is then heated by energizing the heating cartridges 332 at a temperature well below Tg (the lowest Tg if the organic powder 360 is a mixture of plurality of organic molecules) of the organic powder 360 as a part of the compaction process. A second punch 370 is then located above the die 330 for the next sequence.

FIG. 4C illustrates the compaction step of the process, wherein the second punch 370 is moved by the upper ram of a press (not shown) in a second direction 372, which is opposite to the first direction 322 of the first punch 310. The second punch 370 has a bore 374 so that the cooling tube 350 has enough room to travel during the compaction process. After the die 330 has reached the steady state of a set temperature, a known amount of pressure ranging between 2,000 and 10,000 psi is applied in the second direction 372 to the second punch 370 to complete the compaction process.

Turning to FIG. 4D, the first punch 310 is then pressurized to move in the first direction 322 in order to remove the compacted solid compacted pellet of organic material 380 from the die cavity 320 including the tube 350 as an integral part of the solid compacted pellet of organic material 380. FIG. 4E shows the cross-sectional view of the solid compacted pellet of organic material 380 according to the present invention which is stored in a vacuum container until further use. The shape of the solid compacted pellet of organic material 380 can be varied by selecting a die and corresponding first and second punches so that outer surface can have a chosen profile.

Figure 5:
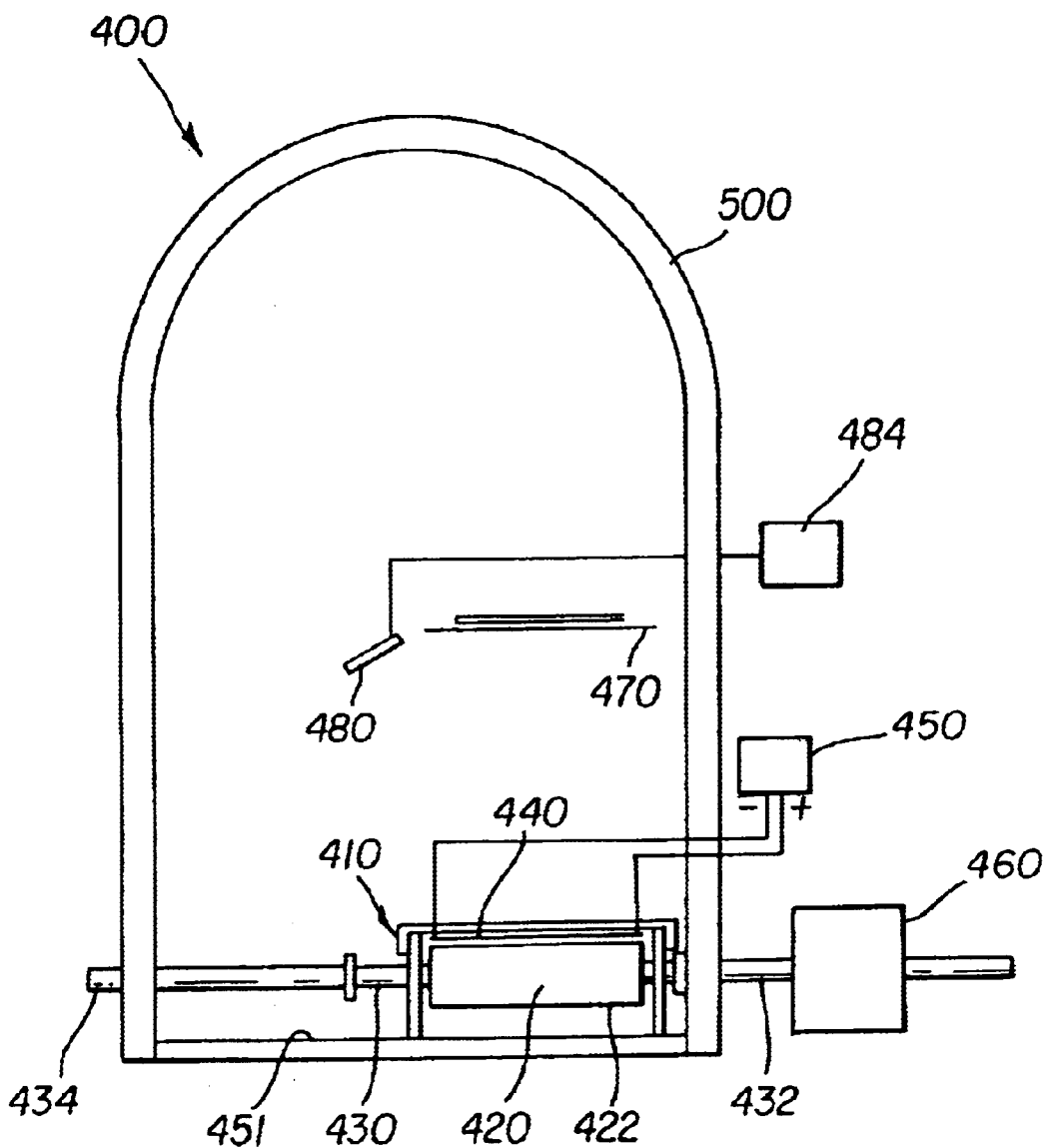
FIG. 5 depicts the schematic representation of a vacuum deposition chamber for OLED displays using the solid compacted pellet of organic material as an evaporation source according to the present invention.

Referring to FIG. 5, there is shown a schematic of the physical vapor deposition chamber 400 for OLED displays including a bell jar 500 which is kept under high vacuum, wherein a solid compacted pellet assembly 410 of organic material including a solid compacted pellet 420 of organic material is anchored to a base plate 451 of the deposition chamber 400. A cooling tube 430 extending through the center of the solid compacted pellet 420 of organic material is connected to an inlet tube 432 and an outlet tube 434 on both ends for the purpose of transmitting cold water through the cooling tube 430 in order to keep the core of the solid compacted pellet of organic material 420 cooler with respect to the outer surface 422. A heating element 440 of the solid compacted pellet assembly 410 of organic material is electrically connected to a power supply 450. Provisions are also made to rotate the solid compacted pellet 420 of organic material by connecting the cooling tube 430 to a mechanical or electrical rotator 460 located outside the physical vapor deposition chamber 400. A substrate 470 is anchored to a fixture spaced apart from the solid compacted pellet of organic material 420. Deposition thickness of organic layers on the substrate 470 is monitored by a crystal 480 which is electrically connected to a deposition rate monitor 484.

The invention has been described in detail with particular reference to certain preferred embodiments thereof, but it will be understood that variations and modifications can be effected within the spirit and scope of the invention.

| PARTS LIST | |
|---|---|
| 10 | linear source |
| 20 | organic material |
| 30 | quartz boat |
| 40 | bottom heater |
| 50 | top heater |
| 60 | baffle |
| 100 | linear source |
| 110 | top heater |
| 120 | opening |
| 130 | quartz boat |
| 200 | solid compacted pellet assembly |
| 210 | solid compacted pellet |
| 220 | cooling tube |
| 230 | refractory boat |
| 240 | rectangular slot |
| 250 | heating element |
| 260 | lid |
| 262 | orifice |
| 264 | top surface |
| 270 | slits |
| 300 | die-punch assembly |
| 310 | first punch |
| 312 | top surface |
| 314 | ledge |
| 316 | die wall |
| 318 | outer surface |
| 320 | die cavity |
| 322 | first direction |
| 324 | recess |
| 330 | die |
| 332 | heating cartridge |
| 340 | seat |
| 350 | cooling tube |
| 360 | organic powder |
| 370 | second punch |
| 372 | second direction |
| 374 | bore |
| 380 | solid compacted pellet |

| -continued | |
|---|---|
| PARTS LIST | |
| 400 | physical vapor deposition chamber |
| 410 | solid compacted pellet assembly |
| 420 | solid compacted pellet |
| 422 | outer surface |
| 430 | cooling tube |
| 432 | inlet tube |
| 434 | outlet tube |
| 440 | heating element |
| 450 | power supply |
| 451 | base plate |
| 460 | rotator |
| 470 | substrate |
| 480 | crystal |
| 484 | deposition rate monitor |
| 500 | bell jar |

What is claimed is:

1. A method of forming solid compacted pellet of organic material for use in a vapor deposition source, comprising the steps of:

(a) providing a cooling tube; and (b) compacting organic material to mold such material into a solid form about the cooling tube.

2. The method of claim 1 wherein the compacting step includes providing heat and pressure to the organic material.

3. A method of forming a pellet of solid compacted organic material adapted for vapor deposition of organic layer on a structure which will form part of an organic light-emitting diode display, comprising the steps of:

(a) providing a die defining a cavity and a first and second punches in opposite sides of the cavity and movable into such cavity, the first and second punches each having corresponding openings for receiving a cooling tube;

(b) providing a metal cooling tube and placing organic material in a powder form inside the die cavity over the first punch and around the metal cooling tube; and (c) applying sufficient heat by a heating source and pressure by the punches to the organic material in the die cavity to compact the organic material into a solid compacted pellet molded about the cooling tube.

4. The method of claim 3 further including the step of removing the compacted pellet from the die cavity and storing in a vacuum chamber until further use.

5. The method of claim 3 wherein the first punch is movable in a first direction within the die cavity.

6. The method of claim 3 wherein the second punch is movable in a second and opposite direction to the first direction to compact the organic material into a compacted organic pellet.

* * * * *